(12) United States Patent
Yang

(10) Patent No.: US 12,224,333 B2
(45) Date of Patent: Feb. 11, 2025

(54) HEMT WITH STAIR-LIKE COMPOUND LAYER AT DRAIN

(71) Applicant: UNITED MICROELECTRONICS CORP., Hsin-Chu (TW)

(72) Inventor: Po-Yu Yang, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 440 days.

(21) Appl. No.: 17/842,814

(22) Filed: Jun. 17, 2022

(65) Prior Publication Data

US 2023/0387250 A1 Nov. 30, 2023

(30) Foreign Application Priority Data

May 26, 2022 (CN) .......................... 202210585589.0

(51) Int. Cl.
*H01L 29/66* (2006.01)
*H01L 29/20* (2006.01)
*H01L 29/423* (2006.01)
*H01L 29/778* (2006.01)

(52) U.S. Cl.
CPC .... *H01L 29/66462* (2013.01); *H01L 29/2003* (2013.01); *H01L 29/42312* (2013.01); *H01L 29/778* (2013.01)

(58) Field of Classification Search
CPC ........... H01L 29/66462; H01L 29/2003; H01L 29/42312; H01L 29/778; H01L 29/0619; H01L 29/1066; H01L 29/7786
See application file for complete search history.

(56) References Cited

U.S. PATENT DOCUMENTS

| 8,044,433 | B2 | 10/2011 | Kawasaki |
| 10,192,986 | B1 | 1/2019 | Khalil |
| 2011/0057257 | A1* | 3/2011 | Park ................... H01L 29/7787 438/270 |
| 2017/0104076 | A1 | 4/2017 | Prechtl |
| 2021/0344340 | A1 | 11/2021 | Kim |
| 2022/0302259 | A1 | 9/2022 | Yamagiwa |

FOREIGN PATENT DOCUMENTS

| CN | 114207837 A | 3/2022 |
| WO | 2020/007265 A1 | 1/2020 |
| WO | 2021/039631 A1 | 3/2021 |

OTHER PUBLICATIONS

Zhuocheng Wang et al., Reverse Blocking HEMTs with Stepped P-GaN Drain, International Conference on IC Design and Technology (ICICDT), 2021, IEEE, XP034037827, 2021.

* cited by examiner

*Primary Examiner* — Mohammed R Alam
(74) *Attorney, Agent, or Firm* — Winston Hsu

(57) ABSTRACT

An HEMT with a stair-like compound layer as a drain includes a first III-V compound layer. A second III-V compound layer is disposed on the first III-V compound layer. The composition of the first III-V compound layer and the second III-V compound layer are different from each other. A source electrode, a gate electrode and a drain electrode are disposed on the second III-V compound layer. The gate electrode is disposed between the source electrode and the drain electrode. A first P-type III-V compound layer is disposed between the drain electrode and the second III-V compound layer. The first P-type III-V compound layer is stair-like.

13 Claims, 5 Drawing Sheets

HEMT WITH STAIR-LIKE COMPOUND LAYER AT DRAIN

BACKGROUND OF THE INVENTION

1. Field of the Invention

The present invention relates to a high electron mobility transistor (HEMT) with a stair-like compound layer.

2. Description of the Prior Art

Due to their semiconductor characteristics, III-V semiconductor compounds may be applied in many kinds of integrated circuit devices, such as high power field effect transistors, high frequency transistors, or high electron mobility transistors (HEMTs). In the high electron mobility transistor, two semiconductor materials with different bandgaps are combined and a heterojunction is formed at the junction between the semiconductor materials as a channel for carriers. In recent years, gallium nitride (GaN) based materials have been applied in high power and high frequency products because of their properties of wider bandgap and high saturation velocity.

A two-dimensional electron gas (2DEG) may be generated by the piezoelectric property of the GaN-based materials, and the switching velocity may be enhanced because of the higher electron velocity and the higher electron density of the 2DEG.

However, trapped electrons are generated during the operation of the HEMT, which affects the performance of the HEMT.

SUMMARY OF THE INVENTION

In view of this, an HEMT with a stair-like compound layer as a drain is provided in the present invention to remove trapped electrons without increasing on-resistance.

According to a preferred embodiment of the present invention, an HEMT with a stair-like compound layer as a drain includes a first III-V compound layer. A second III-V compound layer is disposed on the first III-V compound layer, wherein composition of the first III-V compound layer and composition of the second III-V compound layer are different from each other. A source electrode, a gate electrode and a drain electrode are disposed on the second III-V compound layer, wherein the gate electrode is disposed between the source electrode and the drain electrode. A first P-type III-V compound layer is disposed between the drain electrode and the second III-V compound layer, wherein the first P-type III-V compound layer has a stair-like shape.

According to another preferred embodiment of the present invention, an HEMT with a stair-like compound layer as a drain includes a first III-V compound layer. A second III-V compound layer is disposed on the first III-V compound layer, wherein composition of the first III-V compound layer and composition of the second III-V compound layer are different from each other. A source electrode, a gate electrode and a drain electrode disposed on the second III-V compound layer, wherein the gate electrode is disposed between the source electrode and the drain electrode, the drain electrode includes a first part and a second part, material of the first part is different from material of the second part. A first P-type III-V compound layer is disposed between the drain electrode and the second III-V compound layer, wherein the first P-type III-V compound layer has a stair-like shape, and Schottky contact is between the first part and the first P-type III-V compound layer.

According to yet another preferred embodiment of the present invention, a fabricating method of an HEMT with a stair-like compound layer as a drain includes providing a III-V compound layer. Next, P-type III-V compound layer formed to cover the III-V compound layer. Subsequently, the P-type III-V compound layer is segmented to form a first P-type III-V compound layer and a second P-type III-V compound layer. Later, the first P-type III-V compound layer is patterned to make the first P-type III-V compound layer to have a stair-like shape. After patterning the first P-type III-V compound layer, a source electrode, a gate electrode and a drain electrode are formed, wherein the gate electrode is disposed on the second III-V compound layer, the drain electrode is disposed on the first P-type III-V compound layer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 6 depict a fabricating method of an HEMT with a stair-like compound layer as a drain according to a first preferred embodiment of the present invention, wherein:

FIG. 2 is a stage in continuous from FIG. 1;
FIG. 3 is a stage in continuous from FIG. 2;
FIG. 4 is a stage in continuous from FIG. 3;
FIG. 5 is a stage in continuous from FIG. 4;
and
FIG. 6 is a stage in continuous from FIG. 5.

DETAILED DESCRIPTION

FIG. 1 to FIG. 6 depict a fabricating method of a high electron mobility transistor (HEMT) with a stair-like compound layer as a drain according to a first preferred embodiment of the present invention.

Figure 1:
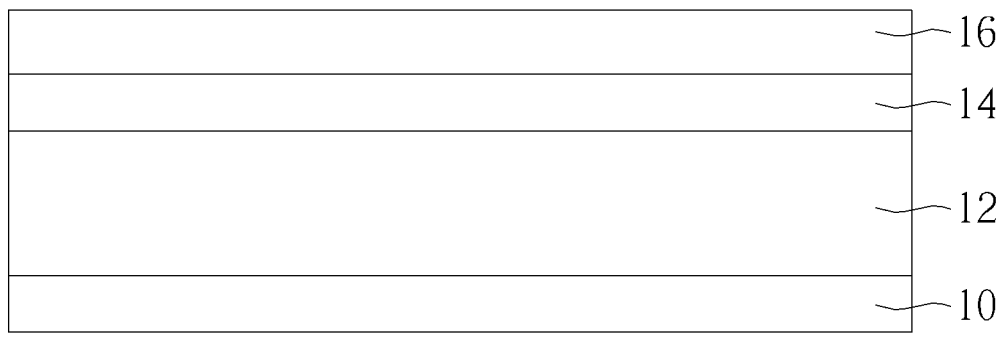

As shown in FIG. 1, a substrate 10 is provided. The substrate 10 may include a silicon substrate and a barrier. Next, a first III-V compound layer 12, a second III-V compound layer 14 and a P-type III-V compound layer 16 are formed in sequence to cover the substrate 10. The P-type III-V compound layer 16 covers and contacts the second III-V compound layer 14. The second III-V compound layer 14 covers and contacts the first III-V compound layer 12. The first III-V compound layer 12 covers and contacts the barrier of the substrate 10. The barrier may be III-V compounds such as aluminum gallium nitride. The P-type III-V compound layer 16 is preferably P-type gallium nitride. The second III-V compound layer 14 is preferably aluminum gallium nitride. The first III-V compound layer 12 is preferably gallium nitride. However, based on different product requirements, the barrier, the P-type III-V compound layer 16, the second III-V compound layer 14, the first III-V compound layer 12 may be independently selected from aluminum gallium nitride, aluminum indium nitride, aluminum indium gallium nitride, aluminum nitride or other III-V compounds.

Figure 2:
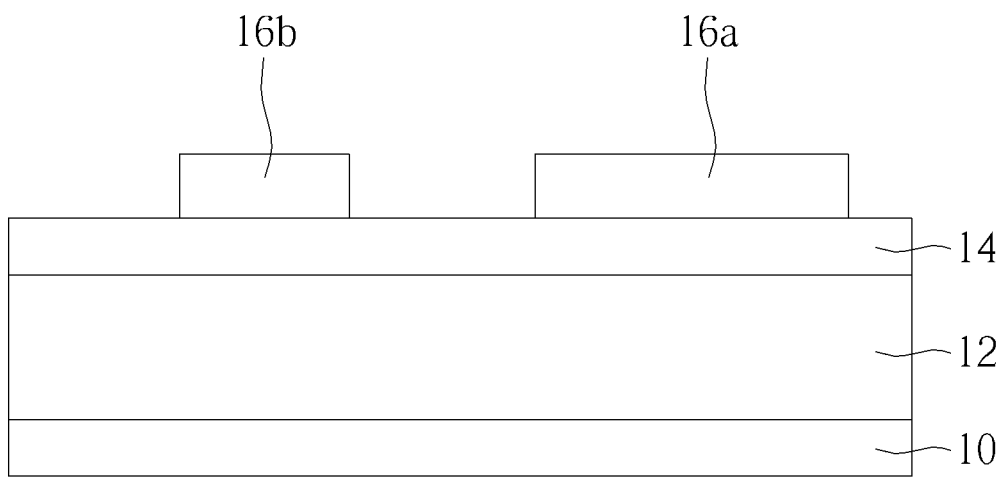

As shown in FIG. 2, the P-type III-V compound layer 16 is segmented to form a first P-type III-V compound layer 16a and a second P-type III-V compound layer 16b. According to a preferred embodiment of the present invention, the P-type III-V compound layer 16 can be segmented by an etching process.

Figure 3:
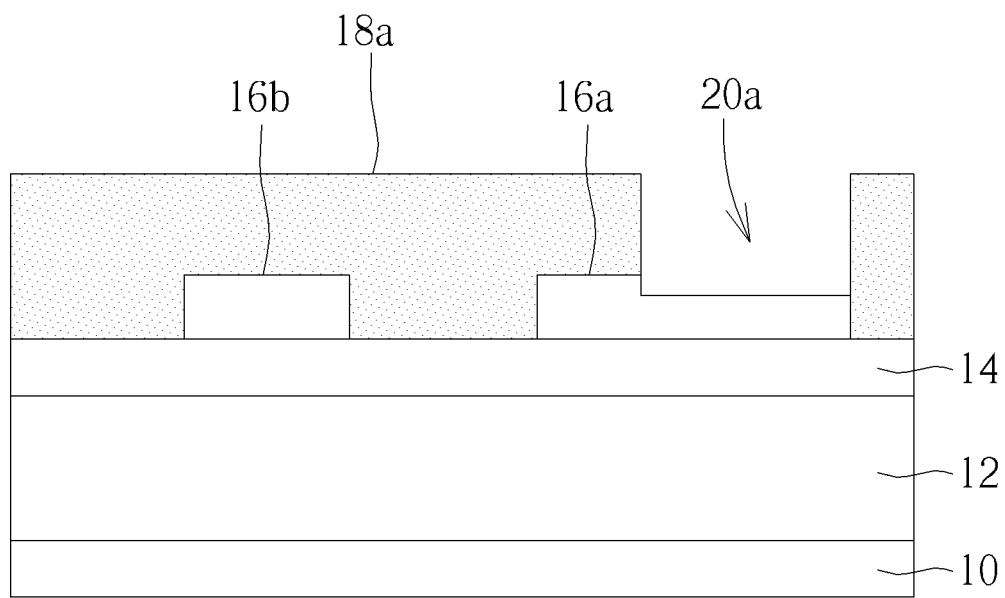
Figure 4:
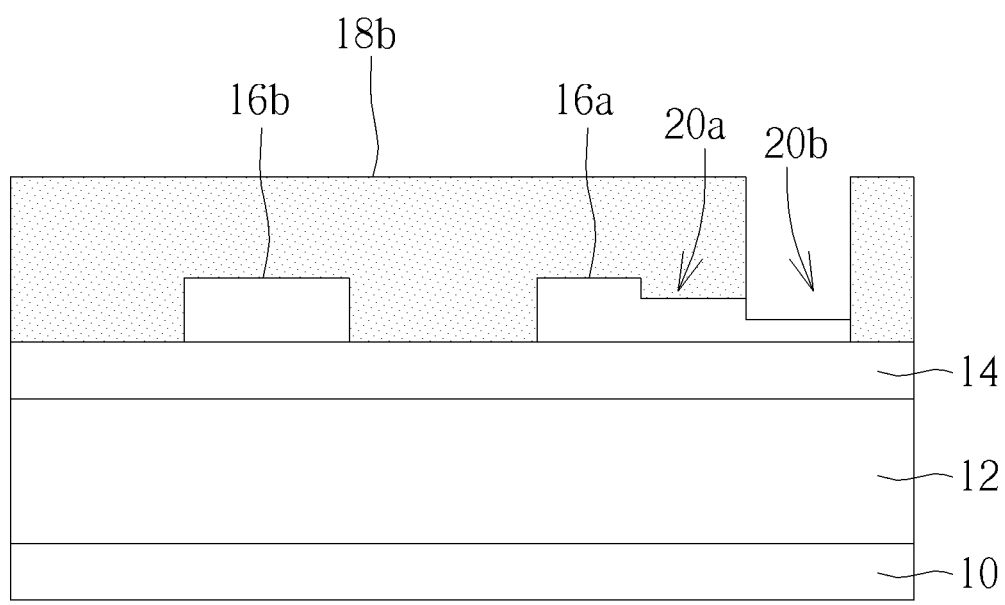

Next, the first P-type III-V compound layer 16a is patterned to make the first P-type III-V compound layer 16a to have a stair-like shape. In details, as shown in FIG. 3, a first patterned photoresist 18a is formed to cover the second P-type III-V compound layer 16b, the second III-V compound layer 14 and part of the first P-type III-V compound layer 16a. The first P-type III-V compound layer 16a farther from the second P-type III-V compound layer 16b is exposed from the first patterned photoresist 18a. Later, the exposed first P-type III-V compound layer 16a is etched to form a recess 20a within the surface of the first P-type III-V compound layer 16a. As shown in FIG. 4, after the first patterned photoresist 18a is removed, a second patterned photoresist 18b is formed to cover the second P-type III-V compound layer 16b, the second III-V compound layer 14 and part of the first P-type III-V compound layer 16a. Only part of the recess 20a is exposed through the second patterned photoresist 18b. Subsequently, the recess 20a which is exposed is etched to form another recess 20b. A vertical distance between the recess 20b and the second III-V compound layer 14 is smaller than a vertical distance between the recess 20a and the second III-V compound layer 14. The fabricating stages of forming recess 20a/20b can be repeated several times to make the first P-type III-V compound layer 16a to have a stair-like shape. It is note-worthy that the steps constituting the stair-like shape go down toward a direction away from the second P-type III-V compound layer 16b.

Figure 5:
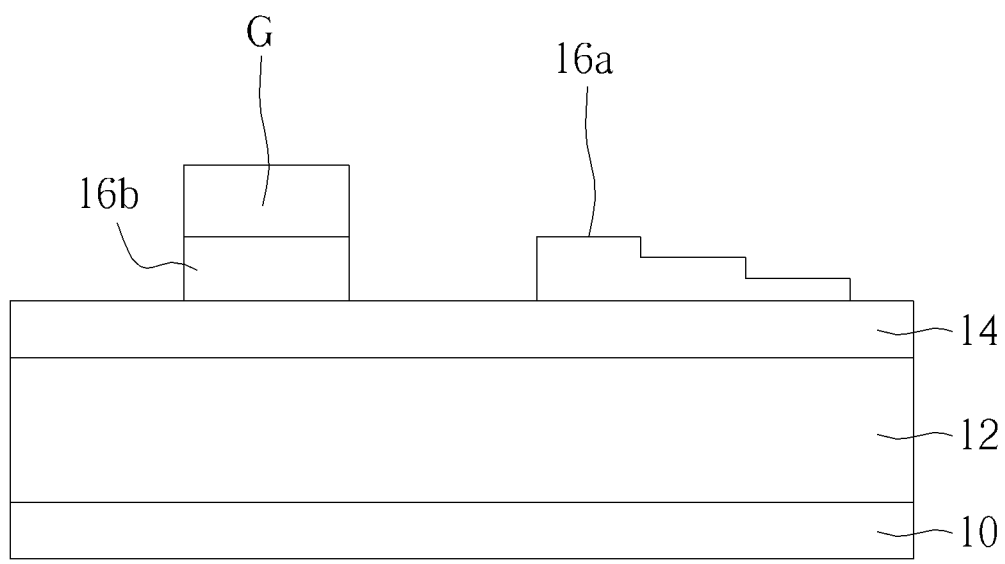
Figure 6:
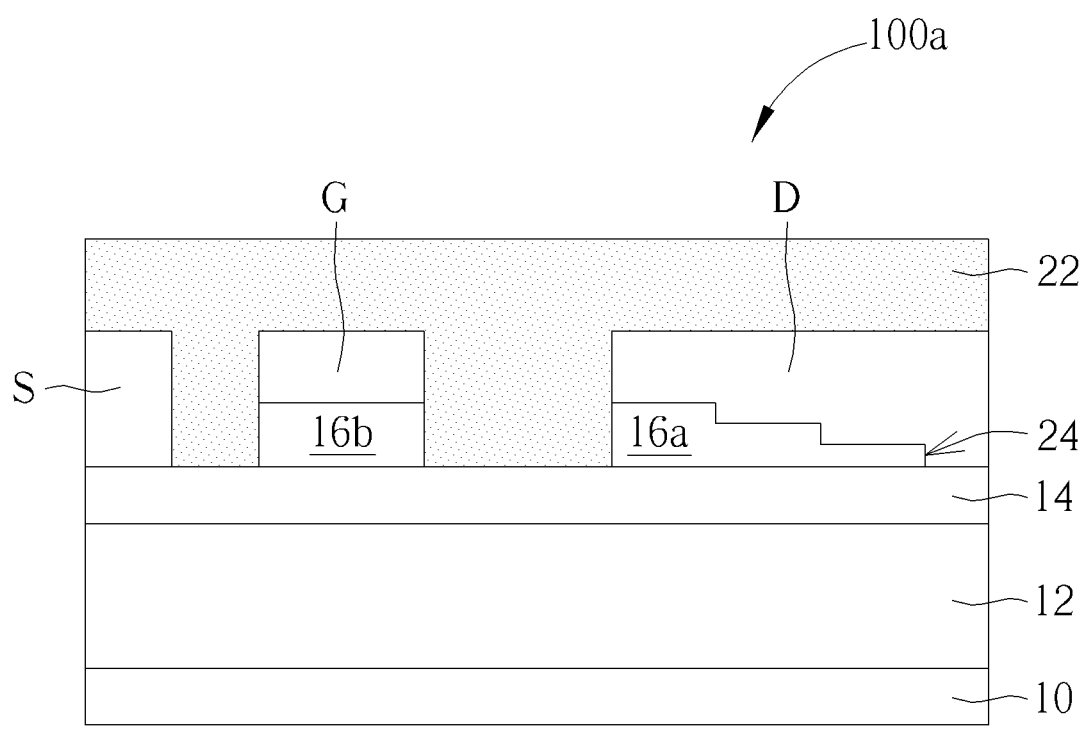

As shown in FIG. 5, after the second patterned photoresist 18a is removed, a gate electrode G is formed to contact and cover the second P-type III-V compound layer 16b. Schottky contact is between the gate electrode G and the second P-type III-V compound layer 16b. For example, the gate electrode G includes nickel or gold. As shown in FIG. 6, a drain electrode D and a source electrode S are formed simultaneously. The drain electrode D covers and contacts the first P-type III-V compound layer 16a and contacts the second III-V compound layer 14. Source electrode S covers and contacts the second III-V compound layer 14. The drain electrode D is at one side of the gate electrode G. The source electrode S is at another side of the gate electrode G which is opposed to the drain electrode D. Moreover, Ohmic contact is between the drain electrode D and the first P-type III-V compound layer 16a and between drain electrode D and the second III-V compound layer 14. Ohmic contact is also between the source electrode S and the second III-V compound layer 14. The drain electrode D and the source electrode S may include titanium, aluminum, nickel, gold or titanium nitride. For example, the drain electrode D and the source electrode S can respectively be composite materials formed by stacking titanium, aluminum, nickel and gold in sequence or formed by stacking titanium, aluminum, titanium and titanium nitride in sequence. After the drain electrode D and the source electrode S are formed, an insulating layer 22 such as silicon oxide is formed to cover and contact the drain electrode D, the source electrode S, the gate electrode G and to fill up space between the drain electrode D, the source electrode S, the gate electrode G. Now, an HEMT 100a with a stair-like compound layer as a drain of the present invention is completed.

Figure 7:
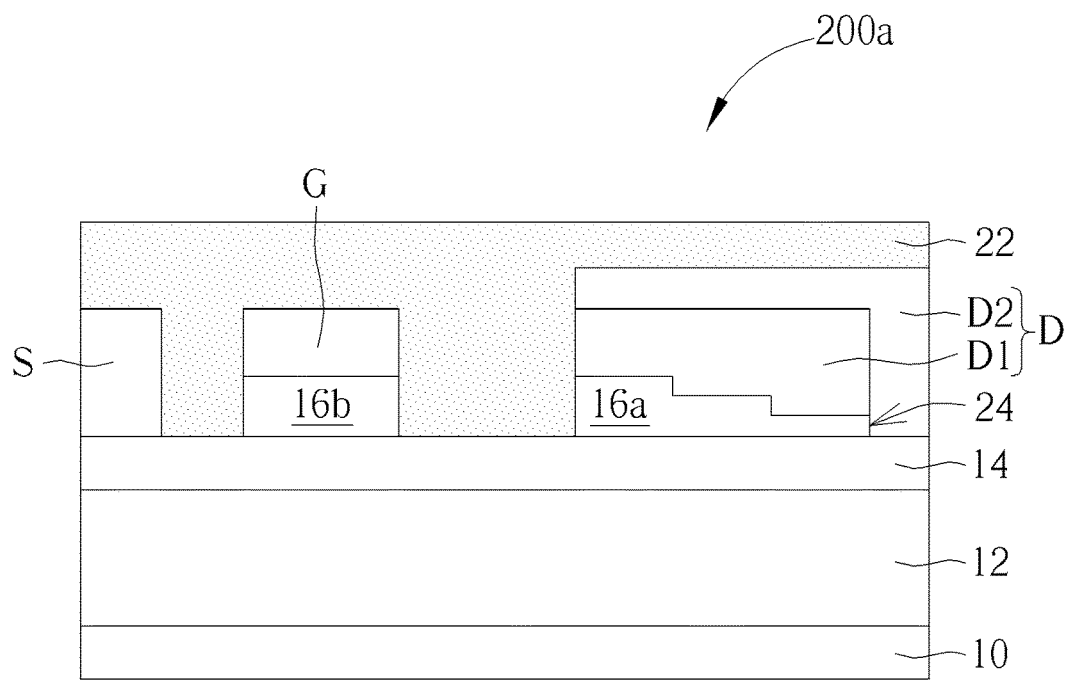
FIG. 7 depicts depict a fabricating method of an HEMT with a stair-like compound layer as a drain according to a second preferred embodiment of the present invention.

FIG. 7 depicts a fabricating method of an HEMT with a stair-like compound layer as a drain according to a second preferred embodiment of the present invention, wherein elements which are substantially the same as those in the first preferred embodiment are denoted by the same reference numerals; an accompanying explanation is therefore omitted. The difference between the second preferred embodiment and the first preferred embodiment is that both Ohmic contact and Schottky contact are between the drain electrode D and the first P-type III-V compound layer 16a. Other elements are the same as that in the first preferred embodiment. In details, after fabricating stages in FIG. 1 to FIG. 4 are completed, as shown in FIG. 7, the second patterned photoresist layer 18b is removed. Then, a first part D1 of the drain electrode D and the gate electrode G are formed simultaneously. The first part D1 of the drain electrode D covers and contacts the top surface of the first P-type III-V compound layer 16a. Schottky contact is between the first part D1 of the drain electrode D and the first P-type III-V compound layer 16a. Similarly, Schottky contact is also between the gate electrode G and the second P-type III-V compound layer 16b.

Later, the second part D2 of the drain electrode D and the source electrode S are formed. The second part D2 of the drain electrode D covers and contacts the first part D1 of the drain D, and also contacts the second III-V compound layer 14 and an end of the first P-type III-V compound layer 16a. Ohmic contact is between the second part D2 of the drain electrode D and the first P-type III-V compound layer 16a. Later, an insulating layer 22 such as silicon oxide is formed to cover and contact the drain electrode D, the source electrode S, the gate electrode G and to fill up space between the drain electrode D, the source electrode S, the gate electrode G. Now, an HEMT 200a with a stair-like compound layer as a drain of the present invention is completed.

FIG. 6 depicts an HEMT with a stair-like compound layer as a drain fabricated by the stages disclosed in the first preferred embodiment, wherein elements which are substantially the same as those in the first preferred embodiment are denoted by the same reference numerals; an accompanying explanation is therefore omitted. As shown in FIG. 6, an HEMT 100a with a stair-like compound layer as a drain includes a first III-V compound layer 12. The second III-V compound layer 14 is disposed on the first III-V compound layer 12. The composition of the first III-V compound layer 12 and the composition of the second III-V compound layer 14 are different from each other. A source electrode S, a gate electrode G and a drain electrode D are disposed on the second III-V compound layer 14, wherein the gate electrode G is disposed between the source electrode S and the drain electrode D. A first P-type III-V compound layer 16a is disposed between the drain electrode D and the second III-V compound layer 14, wherein the first P-type III-V compound layer 16a has a stair-like shape. The steps constituting the stair-like shape go down toward a direction away from the gate electrode G. The drain electrode D contacts the first P-type III-V compound layer 16a, and the second III-V compound layer 14. In details, the first P-type III-V compound layer 16a includes numerous steps, the bottommost step of steps includes a vertical sidewall 24, and the drain electrode D contacts the vertical sidewall 24. Ohmic contact is between the drain electrode D and the first P-type III-V compound layer 16a. A second P-type III-V compound layer 16b is disposed between the gate electrode G and the second III-V compound layer 14. In this embodiment, the drain electrode D is farther from the gate electrode G, and the source electrode S is closer to the gate electrode G. However, based on different product requirements, the distance between the drain electrode D and the gate electrode G can be the same as the distance between the source electrode S and the gate electrode G.

Figure 8:
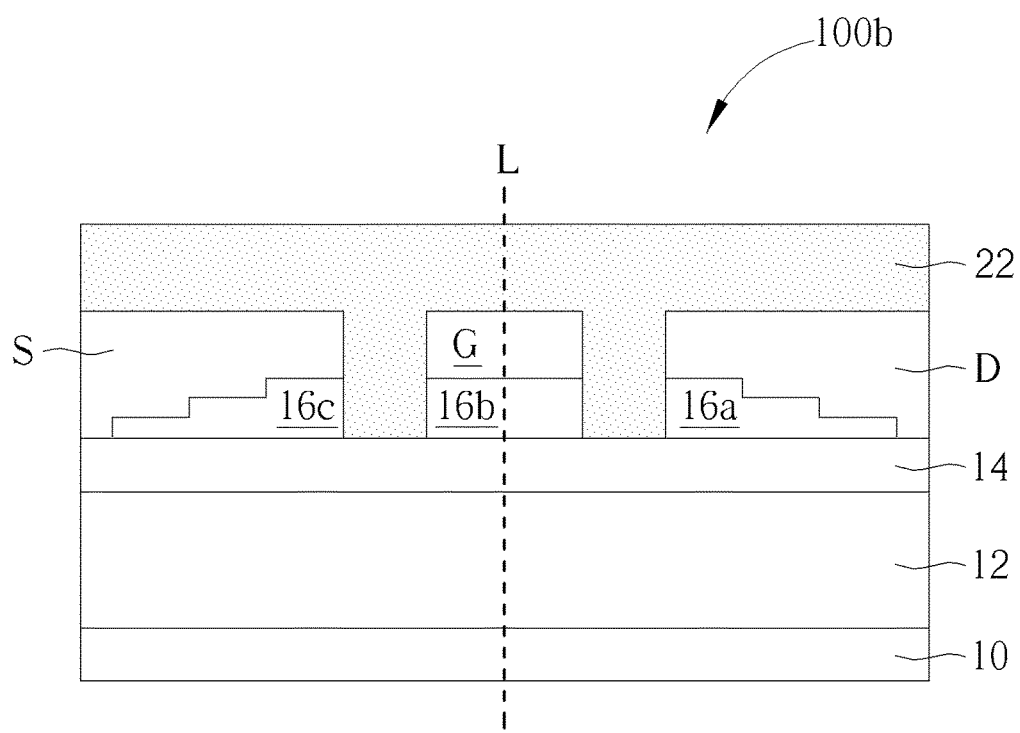
FIG. 8 depicts a varied type of an HEMT according to FIG. 6.

FIG. 8 depicts a varied type of an HEMT according to FIG. 6, wherein elements which are substantially the same as those in FIG. 6 are denoted by the same reference numerals; an accompanying explanation is therefore omitted. The HEMT 100b with a stair-like compound layer as a drain includes a third P-type III-V compound layer 16c disposed between the source electrode S and the second III-V compound layer 14, wherein a symmetry line L of the gate electrode G is perpendicular to a top surface of the second III-V compound layer 14. Based on the symmetry line L, the source electrode S and the drain electrode D are mirror symmetry, and the third P-type III-V compound layer 16c and the first P-type III-V compound layer 16a are mirror symmetry. That is, both of the third P-type III-V compound layer 16c and the first P-type III-V compound layer 16a have stair-like shapes. The source electrode S covers and contacts the third P-type III-V compound layer 16c. Because the distance between the drain electrode D and the gate electrode G is the same as the distance between the source electrode S and the gate electrode G, the drain electrode D and the source electrode S of the HEMT 100b can be exchanged during operation.

FIG. 7 depicts an HEMT with a stair-like compound layer as a drain fabricated by the stages disclosed in the second preferred embodiment, wherein elements which are substantially the same as those in the second preferred embodiment are denoted by the same reference numerals; an accompanying explanation is therefore omitted. As shown in FIG. 7, An HEMT 200a with a stair-like compound layer as a drain includes a first III-V compound layer 12. A second III-V compound layer 14 is disposed on the first III-V compound layer 12, wherein the composition of the first III-V compound layer 12 and the composition of the second III-V compound layer 14 are different from each other. A source electrode S, a gate electrode G and a drain electrode D are disposed on the second III-V compound layer 14, wherein the gate electrode G is disposed between the source electrode S and the drain electrode D. The drain electrode D includes a first part D1 and a second part D2. The material of the first part D1 is different from material of the second part D2. A first P-type III-V compound layer 16a is disposed between the drain electrode D and the second III-V compound layer 14. A second P-type III-V compound layer 16b is disposed between the gate electrode G and the second III-V compound layer 14. The first P-type III-V compound layer 16a has a stair-like shape. The steps constituting the stair-like shape go down toward a direction away from the gate electrode G. Schottky contact is between the first part D1 and the first P-type III-V compound layer 14. The first part D1 is between the second part D2 and the first P-type III-V compound layer 16a. Moreover, the first P-type III-V compound layer 16a includes numerous steps, the bottommost step of the steps includes a vertical sidewall 24, the second part D2 contacts the vertical sidewall 24 and the second part D2 also contacts the second III-V compound layer 14. Ohmic contact is between the second part D2 and the vertical sidewall 24. In this embodiment, the drain electrode D is farther from the gate electrode G, and the source electrode S is closer to the gate electrode G. However, based on different product requirements, the distance between the drain electrode D and the gate electrode G can be the same as the distance between the source electrode S and the gate electrode G.

Figure 9:
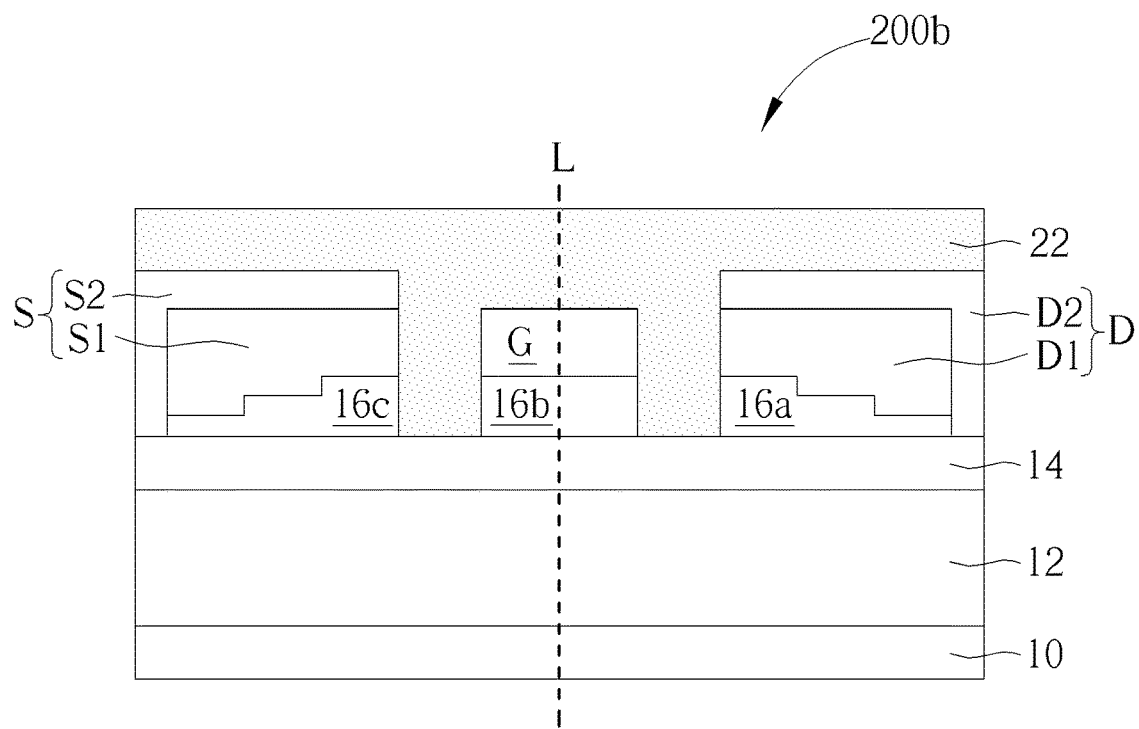
FIG. 9 depicts a varied type of an HEMT according to FIG. 7.

FIG. 9 depicts a varied type of an HEMT according to FIG. 7, wherein elements which are substantially the same as those in FIG. 7 are denoted by the same reference numerals; an accompanying explanation is therefore omitted. The HEMT 200b with a stair-like compound layer as a drain includes a third P-type III-V compound layer 16c disposed between the source electrode S and the second III-V compound layer 14, wherein a symmetry line L of the gate electrode G is perpendicular to a top surface of the second III-V compound layer 14. Based on the symmetry line L, the source electrode S and the drain electrode D are mirror symmetry. Therefore, the source electrode S also has a first part S1 and a second part S2. The third P-type III-V compound layer 16c and the first P-type III-V compound layer 16a are mirror symmetry. That is, both of the third P-type III-V compound layer 16c and the first P-type III-V compound layer 16a have stair-like shapes. Because the distance between the drain electrode D and the gate electrode G is the same as the distance between the source electrode S and the gate electrode G, the drain electrode D and the source electrode S of the HEMT 200b can be exchanged during operation.

Figure 10:
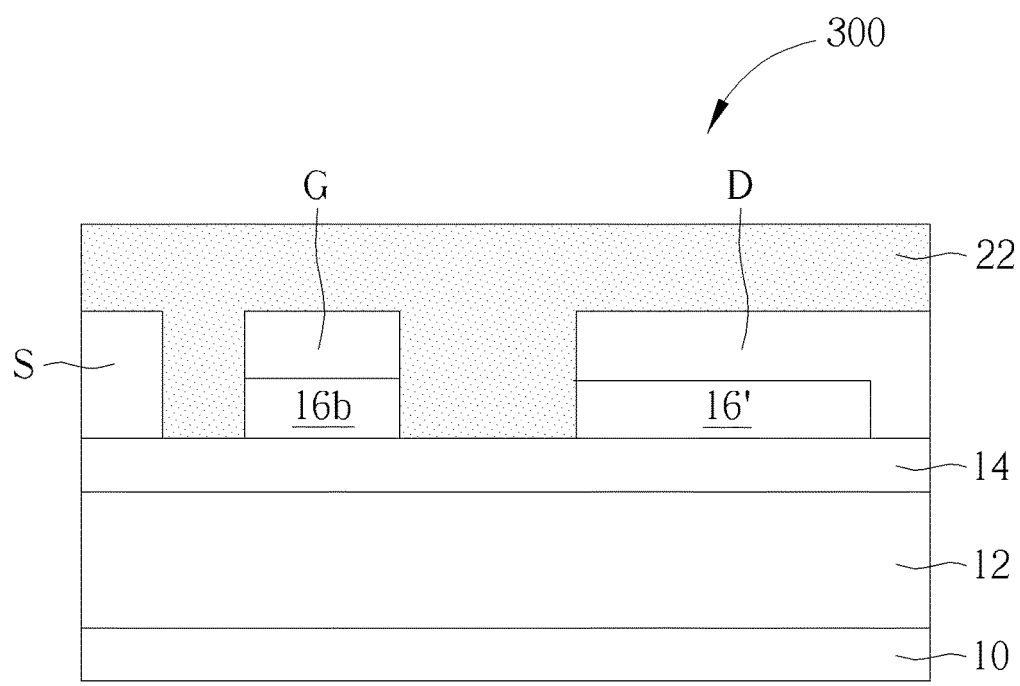
FIG. 10 depicts an HEMT according an example of the present invention.

FIG. 10 depicts an HEMT according an example of the present invention, wherein elements which are substantially the same as those in the first preferred embodiment are denoted by the same reference numerals; an accompanying explanation is therefore omitted.

Comparing to the HEMTs in FIGS. 6 to 9, the first P-type III-V compound layer 16' of the HEMT 300 in FIG. 10 doesn't have stair-like shape. The first P-type III-V compound layer 16' is used to remove trapped electrons within the first III-V compound layer 12 and the second III-V compound layer 14. However, the first P-type III-V compound layer 16' decreases density of two-dimensional electron gas (2DEG) which is below the first P-type III-V compound layer 16'. In this way, the on-resistance of the HEMT 300 will increase.

The density of 2DEG below the first P-type III-V compound layer 16a with stair-like shape in FIGS. 6 to 9 is higher than the density of 2DEG below the first P-type III-V compound layer 16' without stair-like shape in FIG. 10. Therefore, the first P-type III-V compound layer 16a with stair-like shape can remove trapped electrons and decrease on-resistance.

Furthermore, the HEMTs 200a/200b in FIGS. 7 and 9 have Schottky contact at the drain electrode D. Comparing to the drain electrodes D in FIGS. 6 and 8 which only use Ohmic contact, the drain electrode D with Schottky contact can increase the breakdown voltage of the HEMT.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A high electron mobility transistor (HEMT) with a stair-like compound layer as a drain, comprising: a first III-V compound layer; a second III-V compound layer disposed on the first III-V compound layer, wherein composition of the first III-V compound layer and composition of the second III-V compound layer are different from each other; a source electrode, a gate electrode and a drain electrode disposed on the second III-V compound layer, wherein the gate electrode is disposed between the source electrode and the drain electrode; and a first P-type III-V compound layer disposed between the drain electrode and the second III-V compound layer, wherein the first P-type III-V compound layer has a stair-like shape; wherein steps constituting the stair-like shape go down toward a direction away from the gate electrode.

2. The HEMT with a stair-like compound layer as a drain of claim 1, wherein the drain electrode contacts the first P-type III-V compound layer, and the drain electrode contacts the second III-V compound layer.

3. The HEMT with a stair-like compound layer as a drain of claim 2, wherein the first P-type III-V compound layer comprises a plurality of steps, the bottommost step of the plurality of steps comprises a vertical sidewall, and the drain electrode contacts the vertical sidewall.

4. The HEMT with a stair-like compound layer as a drain of claim 1, wherein Ohmic contact is between the drain electrode and the first P-type III-V compound layer.

5. The HEMT with a stair-like compound layer as a drain of claim 1, further comprising a second P-type III-V compound layer disposed between the gate electrode and the second III-V compound layer.

6. The HEMT with a stair-like compound layer as a drain of claim 1, further comprising a third P-type III-V compound layer disposed between the source electrode and the second III-V compound layer, wherein a symmetry line of the gate electrode is perpendicular to a top surface of the second III-V compound layer, based on the symmetry line, the source electrode and the drain electrode are mirror symmetry, and the third P-type III-V compound layer and the first P-type III-V compound layer are mirror symmetry.

7. A high electron mobility transistor (HEMT) with a stair-like compound layer as a drain, comprising:
a first III-V compound layer;
a second III-V compound layer disposed on the first III-V compound layer, wherein composition of the first III-V compound layer and composition of the second III-V compound layer are different from each other;
a source electrode, a gate electrode and a drain electrode disposed on the second III-V compound layer, wherein the gate electrode is disposed between the source electrode and the drain electrode, the drain electrode comprises a first part and a second part, material of the first part is different from material of the second part; and
a first P-type III-V compound layer disposed between the drain electrode and the second III-V compound layer, wherein the first P-type III-V compound layer has a stair-like shape, and Schottky contact is between the first part and the first P-type III-V compound layer.

8. The HEMT with a stair-like compound layer as a drain of claim 7, wherein the first part is disposed between the second part and the first P-type III-V compound layer.

9. The HEMT with a stair-like compound layer as a drain of claim 7, wherein the first P-type III-V compound layer comprises a plurality of steps, the bottommost step of the plurality of steps comprises a vertical sidewall, the second part contacts the vertical sidewall and the second part contacts the second III-V compound layer.

10. The HEMT with a stair-like compound layer as a drain of claim 9, wherein Ohmic contact is between the second part and the vertical sidewall.

11. The HEMT with a stair-like compound layer as a drain of claim 7, further comprising a second P-type III-V compound layer disposed between the gate electrode and the second III-V compound layer.

12. The HEMT with a stair-like compound layer as a drain of claim 7, further comprising a third P-type III-V compound layer disposed between the source electrode and the second III-V compound layer, wherein a symmetry line of the gate electrode is perpendicular to a top surface of the second III-V compound layer, based on the symmetry line, the source electrode and the drain electrode are mirror symmetry, and the third P-type III-V compound layer and the first P-type III-V compound layer are mirror symmetry.

13. The HEMT with a stair-like compound layer as a drain of claim 7, wherein steps constituting the stair-like shape go down toward a direction away from the gate electrode.

* * * * *